United States Patent
Lusky et al.

(10) Patent No.: US 7,668,017 B2
(45) Date of Patent: Feb. 23, 2010

(54) METHOD OF ERASING NON-VOLATILE MEMORY CELLS

(75) Inventors: Eli Lusky, Tel Aviv (IL); Boaz Eitan, Ra'anana (IL)

(73) Assignee: Saifun Semiconductors Ltd., Netanya (IL)

( * ) Notice: Subject to any disclaimer, the term of this patent is extended or adjusted under 35 U.S.C. 154(b) by 415 days.

(21) Appl. No.: 11/205,716

(22) Filed: Aug. 17, 2005

(65) Prior Publication Data
US 2007/0041249 A1 Feb. 22, 2007

(51) Int. Cl.
*G11C 16/06* (2006.01)

(52) U.S. Cl. .................... 365/185.29; 365/230.06; 365/185.14; 365/185.22

(58) Field of Classification Search ............ 365/185.29, 365/230.06, 185.14, 185.22
See application file for complete search history.

(56) References Cited

U.S. PATENT DOCUMENTS

| | | | |
|---|---|---|---|
| 3,881,180 A | 4/1975 | Gosney, Jr. | |
| 3,895,360 A | 7/1975 | Cricchi et al. | |
| 3,952,325 A | 4/1976 | Beale et al. | |
| 4,016,588 A | 4/1977 | Ohya et al. | |
| 4,017,888 A | 4/1977 | Christie et al. | |
| 4,145,703 A | 3/1979 | Blanchard et al. | |
| 4,151,021 A | 4/1979 | McElroy | |
| 4,173,766 A | 11/1979 | Hayes | |
| 4,173,791 A | 11/1979 | Bell | |
| 4,247,861 A | 1/1981 | Hsu et al. | |
| 4,257,832 A | 3/1981 | Schwabe et al. | |
| 4,281,397 A | 7/1981 | Neal et al. | |
| 4,306,353 A | 12/1981 | Jacobs et al. | |
| 4,342,102 A | 7/1982 | Puar | |
| 4,342,149 A | 8/1982 | Jacobs et al. | |
| 4,360,900 A | 11/1982 | Bate | |
| 4,373,248 A | 2/1983 | McElroy | |
| 4,380,057 A | 4/1983 | Kotecha et al. | |
| 4,388,705 A | 6/1983 | Sheppard | |
| 4,389,705 A | 6/1983 | Sheppard | |
| 4,404,747 A | 9/1983 | Collins | |
| 4,435,786 A | 3/1984 | Tickle | |
| 4,448,400 A | 5/1984 | Harari | |
| 4,471,373 A | 9/1984 | Shimizu et al. | |
| 4,494,016 A | 1/1985 | Ransom et al. | |

(Continued)

FOREIGN PATENT DOCUMENTS

EP 0 656 628 6/1995

(Continued)

OTHER PUBLICATIONS

U.S. Appl. No. 08/902,890, filed Jul. 30, 1997, Eitan.

(Continued)

*Primary Examiner*—Thong Q Le
(74) *Attorney, Agent, or Firm*—Eitan Mehulal Law Group

(57) ABSTRACT

A method includes determining groups of rows to erase together in order to minimize the margin loss associated with bake after a large number of program and erasure cycles. The method alternatively includes determining groups of rows to erase together to minimize the width of a resultant erase threshold voltage distribution, erasing the groups together, stopping erasure of a group when the group is erase verified and performing the step of erasing on those groups which were not previously erase verified.

21 Claims, 3 Drawing Sheets

U.S. PATENT DOCUMENTS

| | | |
|---|---|---|
| 4,507,673 A | 3/1985 | Aoyama |
| 4,521,796 A | 6/1985 | Rajkanan et al. |
| 4,527,257 A | 7/1985 | Cricchi |
| 4,586,163 A | 4/1986 | Koike |
| 4,613,956 A | 9/1986 | Paterson et al. |
| 4,630,085 A | 12/1986 | Koyama |
| 4,663,645 A | 5/1987 | Komori et al. |
| 4,665,426 A | 5/1987 | Allen et al. |
| 4,667,217 A | 5/1987 | Janning |
| 4,672,409 A | 6/1987 | Takei et al. |
| 4,725,984 A | 2/1988 | Ip et al. |
| 4,733,105 A | 3/1988 | Shin et al. |
| 4,742,491 A | 5/1988 | Liang et al. |
| 4,758,869 A | 7/1988 | Eitan et al. |
| 4,760,555 A | 7/1988 | Gelsomini et al. |
| 4,761,764 A | 8/1988 | Watanabe |
| 4,769,340 A | 9/1988 | Chang et al. |
| 4,780,424 A | 10/1988 | Holler et al. |
| 4,839,705 A | 6/1989 | Tigelaar et al. |
| 4,847,808 A | 7/1989 | Kobatake |
| 4,857,770 A | 8/1989 | Partovi et al. |
| 4,870,470 A | 9/1989 | Bass, Jr. et al. |
| 4,916,671 A | 4/1990 | Ichiguchi |
| 4,941,028 A | 7/1990 | Chen et al. |
| 4,961,010 A | 10/1990 | Davis |
| 4,992,391 A | 2/1991 | Wang |
| 5,021,999 A | 6/1991 | Kohda et al. |
| 5,027,321 A | 6/1991 | Park |
| 5,029,063 A | 7/1991 | Lingstaedt et al. |
| 5,042,009 A | 8/1991 | Kazerounian et al. |
| 5,075,245 A | 12/1991 | Woo et al. |
| 5,081,371 A | 1/1992 | Wong |
| 5,086,325 A | 2/1992 | Schumann et al. |
| 5,094,968 A | 3/1992 | Schumann et al. |
| 5,104,819 A | 4/1992 | Freiberger et al. |
| 5,117,389 A | 5/1992 | Yiu |
| 5,120,672 A | 6/1992 | Mitchell et al. |
| 5,142,495 A | 8/1992 | Canepa |
| 5,142,496 A | 8/1992 | Van Buskirk |
| 5,159,570 A | 10/1992 | Mitchell et al. |
| 5,168,334 A | 12/1992 | Mitchell et al. |
| 5,172,338 A | 12/1992 | Mehrotra et al. |
| 5,175,120 A | 12/1992 | Lee |
| 5,204,835 A | 4/1993 | Eitan |
| 5,214,303 A | 5/1993 | Aoki |
| 5,237,213 A | 8/1993 | Tanoi |
| 5,241,497 A | 8/1993 | Komarek |
| 5,260,593 A | 11/1993 | Lee |
| 5,268,861 A | 12/1993 | Hotta |
| 5,276,646 A | 1/1994 | Kim et al. |
| 5,280,420 A | 1/1994 | Rapp |
| 5,289,412 A | 2/1994 | Frary et al. |
| 5,293,563 A | 3/1994 | Ohta |
| 5,295,092 A | 3/1994 | Hotta et al. |
| 5,295,108 A | 3/1994 | Higa |
| 5,305,262 A | 4/1994 | Yoneda |
| 5,311,049 A | 5/1994 | Tsuruta |
| 5,315,541 A | 5/1994 | Harari et al. |
| 5,324,675 A | 6/1994 | Hayabuchi |
| 5,334,555 A | 8/1994 | Sugiyama et al. |
| 5,335,198 A | 8/1994 | Van Buskirk et al. |
| 5,338,954 A | 8/1994 | Shimoji |
| 5,345,425 A | 9/1994 | Shikatani |
| 5,349,221 A | 9/1994 | Shimoji |
| 5,350,710 A | 9/1994 | Hong et al. |
| 5,352,620 A | 10/1994 | Komori et al. |
| 5,357,134 A | 10/1994 | Shimoji |
| 5,359,554 A | 10/1994 | Odake et al. |
| 5,361,343 A | 11/1994 | Kosonocky et al. |
| 5,366,915 A | 11/1994 | Kodama |
| 5,375,094 A | 12/1994 | Naruke |
| 5,381,374 A | 1/1995 | Shiraishi et al. |
| 5,393,701 A | 2/1995 | Ko et al. |
| 5,394,355 A | 2/1995 | Uramoto et al. |
| 5,399,891 A | 3/1995 | Yiu et al. |
| 5,400,286 A | 3/1995 | Chu et al. |
| 5,402,374 A | 3/1995 | Tsuruta et al. |
| 5,412,601 A | 5/1995 | Sawada et al. |
| 5,414,693 A | 5/1995 | Ma et al. |
| 5,418,176 A | 5/1995 | Yang et al. |
| 5,418,743 A | 5/1995 | Tomioka et al. |
| 5,422,844 A | 6/1995 | Wolstenholme et al. |
| 5,424,567 A | 6/1995 | Chen |
| 5,424,978 A | 6/1995 | Wada et al. |
| 5,426,605 A | 6/1995 | Van Berkel et al. |
| 5,434,825 A | 7/1995 | Harari et al. |
| 5,436,478 A | 7/1995 | Bergemont et al. |
| 5,436,481 A | 7/1995 | Egawa et al. |
| 5,440,505 A | 8/1995 | Fazio et al. |
| 5,450,341 A | 9/1995 | Sawada et al. |
| 5,450,354 A | 9/1995 | Sawada et al. |
| 5,455,793 A | 10/1995 | Amin et al. |
| 5,467,308 A | 11/1995 | Chang et al. |
| 5,477,499 A | 12/1995 | Van Buskirk et al. |
| 5,495,440 A | 2/1996 | Asakura |
| 5,496,753 A | 3/1996 | Sakurai et al. |
| 5,508,968 A | 4/1996 | Collins et al. |
| 5,517,138 A * | 5/1996 | Baltar et al. ................ 326/105 |
| 5,518,942 A | 5/1996 | Shrivastava |
| 5,521,870 A | 5/1996 | Ishikawa |
| 5,523,251 A | 6/1996 | Hong |
| 5,523,972 A | 6/1996 | Rashid et al. |
| 5,530,803 A | 6/1996 | Chang et al. |
| 5,534,804 A | 7/1996 | Woo |
| 5,537,358 A | 7/1996 | Fong |
| 5,544,116 A | 8/1996 | Chao et al. |
| 5,553,018 A | 9/1996 | Wang et al. |
| 5,553,030 A | 9/1996 | Tedrow et al. |
| 5,557,221 A | 9/1996 | Taguchi et al. |
| 5,557,570 A | 9/1996 | Iwahashi |
| 5,559,687 A | 9/1996 | Nicollini et al. |
| 5,563,823 A | 10/1996 | Yiu et al. |
| 5,568,085 A | 10/1996 | Eitan et al. |
| 5,579,199 A | 11/1996 | Kawamura et al. |
| 5,581,252 A | 12/1996 | Thomas |
| 5,583,808 A | 12/1996 | Brahmbhatt |
| 5,590,068 A | 12/1996 | Bergemont |
| 5,590,074 A | 12/1996 | Akaogi et al. |
| 5,592,417 A | 1/1997 | Mirabel |
| 5,596,527 A | 1/1997 | Tomioka et al. |
| 5,599,727 A | 2/1997 | Hakozaki et al. |
| 5,600,586 A | 2/1997 | Lee et al. |
| 5,606,523 A | 2/1997 | Mirabel |
| 5,608,679 A | 3/1997 | Mi et al. |
| 5,612,642 A | 3/1997 | McClinyock |
| 5,617,357 A | 4/1997 | Haddad et al. |
| 5,623,438 A | 4/1997 | Guritz et al. |
| 5,627,790 A | 5/1997 | Golla et al. |
| 5,633,603 A | 5/1997 | Lee |
| 5,636,288 A | 6/1997 | Bonneville et al. |
| 5,644,531 A | 7/1997 | Kuo et al. |
| 5,654,568 A | 8/1997 | Nakao |
| 5,656,513 A | 8/1997 | Wang et al. |
| 5,657,332 A | 8/1997 | Auclair et al. |
| 5,661,060 A | 8/1997 | Gill et al. |
| 5,663,907 A | 9/1997 | Frayer et al. |
| 5,672,959 A | 9/1997 | Der |
| 5,675,280 A | 10/1997 | Nomura |
| 5,677,869 A | 10/1997 | Fazio et al. |
| 5,683,925 A | 11/1997 | Irani et al. |
| 5,689,459 A | 11/1997 | Chang et al. |
| 5,694,356 A | 12/1997 | Wong et al. |
| 5,696,929 A | 12/1997 | Hasbun et al. |
| 5,708,608 A | 1/1998 | Park et al. |

| | | | | | |
|---|---|---|---|---|---|
| 5,712,814 A | 1/1998 | Fratin et al. | 5,969,993 A | 10/1999 | Takeshima |
| 5,712,815 A | 1/1998 | Bill et al. | 5,973,373 A | 10/1999 | Krautschneider et al. |
| 5,715,193 A | 2/1998 | Norman | 5,982,666 A | 11/1999 | Campardo |
| 5,717,581 A | 2/1998 | Canclini | 5,986,940 A | 11/1999 | Atsumi et al. |
| 5,717,632 A | 2/1998 | Richart et al. | 5,990,526 A | 11/1999 | Bez et al. |
| 5,717,635 A | 2/1998 | Akatsu | 5,991,202 A | 11/1999 | Derhacobian et al. |
| 5,726,946 A | 3/1998 | Yamagata et al. | 5,999,444 A | 12/1999 | Fujiwara et al. |
| 5,745,410 A * | 4/1998 | Yiu et al. ............... 365/185.3 | 5,999,494 A | 12/1999 | Holzrichter |
| 5,748,534 A | 5/1998 | Dunlap et al. | 6,000,006 A | 12/1999 | Bruce et al. |
| 5,751,037 A | 5/1998 | Aozasa et al. | 6,005,423 A | 12/1999 | Schultz |
| 5,751,637 A | 5/1998 | Chen et al. | 6,011,725 A | 1/2000 | Eitan |
| 5,754,475 A | 5/1998 | Bill et al. | 6,018,186 A | 1/2000 | Hsu |
| 5,760,445 A | 6/1998 | Diaz | 6,020,241 A | 2/2000 | You et al. |
| 5,760,634 A | 6/1998 | Fu | 6,028,324 A | 2/2000 | Su et al. |
| 5,768,192 A | 6/1998 | Eitan | 6,030,871 A | 2/2000 | Eitan |
| 5,768,193 A | 6/1998 | Lee et al. | 6,034,403 A | 3/2000 | Wu |
| 5,771,197 A | 6/1998 | Kim | 6,034,896 A | 3/2000 | Ranaweera et al. |
| 5,774,395 A | 6/1998 | Richart et al. | 6,037,627 A | 3/2000 | Kitamura et al. |
| 5,777,919 A | 7/1998 | Chi-Yung et al. | 6,040,610 A | 3/2000 | Noguchi et al. |
| 5,781,476 A | 7/1998 | Seki et al. | 6,044,019 A | 3/2000 | Cernea et al. |
| 5,781,478 A | 7/1998 | Takeuchi et al. | 6,044,022 A | 3/2000 | Nachumovsky |
| 5,784,314 A | 7/1998 | Sali et al. | 6,063,666 A | 5/2000 | Chang et al. |
| 5,787,036 A | 7/1998 | Okazawa | 6,064,226 A | 5/2000 | Earl |
| 5,793,079 A | 8/1998 | Georgescu et al. | 6,064,251 A | 5/2000 | Park |
| 5,801,076 A | 9/1998 | Ghneim et al. | 6,064,591 A | 5/2000 | Takeuchi et al. |
| 5,805,500 A | 9/1998 | Campardo et al. | 6,074,916 A | 6/2000 | Cappelletti |
| 5,808,506 A | 9/1998 | Tran | 6,075,402 A | 6/2000 | Ghilardelli |
| 5,812,449 A | 9/1998 | Song | 6,075,724 A | 6/2000 | Li et al. |
| 5,812,456 A | 9/1998 | Hull et al. | 6,078,518 A | 6/2000 | Chevallier |
| 5,812,457 A | 9/1998 | Arase | 6,081,456 A | 6/2000 | Dadashev |
| 5,815,435 A | 9/1998 | Van Tran | 6,084,794 A | 7/2000 | Lu et al. |
| 5,822,256 A | 10/1998 | Bauer et al. | 6,091,640 A | 7/2000 | Kawahara et al. |
| 5,825,683 A | 10/1998 | Chang et al. | 6,094,095 A | 7/2000 | Murray et al. |
| 5,825,686 A | 10/1998 | Schmitt-Landsiedel et al. | 6,097,639 A | 8/2000 | Choi et al. |
| 5,828,601 A | 10/1998 | Hollmer et al. | 6,107,862 A | 8/2000 | Mukainakano et al. |
| 5,834,851 A | 11/1998 | Ikeda et al. | 6,108,240 A | 8/2000 | Lavi et al. |
| 5,835,935 A | 11/1998 | Estakhri et al. | 6,108,241 A | 8/2000 | Chevallier |
| 5,836,772 A | 11/1998 | Chang et al. | 6,117,714 A | 9/2000 | Beatty |
| 5,841,700 A | 11/1998 | Chang | 6,118,207 A | 9/2000 | Ormerod et al. |
| 5,847,441 A | 12/1998 | Cutter et al. | 6,118,692 A | 9/2000 | Banks |
| 5,847,996 A * | 12/1998 | Guterman et al. ...... 365/185.28 | 6,122,198 A | 9/2000 | Haddad et al. |
| 5,848,009 A * | 12/1998 | Lee et al. ................ 365/200 | 6,128,226 A | 10/2000 | Eitan et al. |
| 5,861,771 A | 1/1999 | Matsuda et al. | 6,128,227 A | 10/2000 | Kim |
| 5,862,076 A | 1/1999 | Eitan | 6,130,572 A | 10/2000 | Ghilardelli et al. |
| 5,864,164 A | 1/1999 | Wen | 6,130,574 A | 10/2000 | Bloch et al. |
| 5,867,429 A | 2/1999 | Chen et al. | 6,133,095 A | 10/2000 | Eitan et al. |
| 5,870,334 A | 2/1999 | Hemink et al. | 6,134,156 A | 10/2000 | Eitan |
| 5,870,335 A | 2/1999 | Khan et al. | 6,137,718 A | 10/2000 | Reisinger |
| 5,875,128 A | 2/1999 | Ishizuka et al. | 6,147,904 A | 11/2000 | Liron |
| 5,877,537 A | 3/1999 | Aoki | 6,150,800 A | 11/2000 | Kinoshita et al. |
| 5,880,620 A | 3/1999 | Gitlin et al. | 6,154,081 A | 11/2000 | Pakkala et al. |
| 5,886,927 A | 3/1999 | Takeuchi | 6,156,149 A | 12/2000 | Cheung et al. |
| RE36,179 E | 4/1999 | Shimoda | 6,157,242 A | 12/2000 | Fukui |
| 5,892,710 A | 4/1999 | Fazio et al. | 6,157,570 A | 12/2000 | Nachumovsky |
| 5,903,031 A | 5/1999 | Yamada et al. | 6,163,048 A | 12/2000 | Hirose et al. |
| 5,910,915 A * | 6/1999 | Guterman et al. ...... 365/185.28 | 6,163,484 A | 12/2000 | Uekubo |
| 5,910,924 A | 6/1999 | Tanaka et al. | 6,169,691 B1 | 1/2001 | Pasotti et al. |
| 5,920,503 A | 7/1999 | Lee et al. | 6,175,523 B1 | 1/2001 | Yang et al. |
| 5,920,507 A | 7/1999 | Takeuchi et al. | 6,181,597 B1 | 1/2001 | Nachumovsky |
| 5,926,409 A | 7/1999 | Engh et al. | 6,181,605 B1 | 1/2001 | Hollmer et al. |
| 5,930,195 A | 7/1999 | Komatsu et al. | 6,185,143 B1 | 2/2001 | Perner et al. |
| 5,933,366 A | 8/1999 | Yoshikawa | 6,188,211 B1 | 2/2001 | Rincon-Mora et al. |
| 5,933,367 A | 8/1999 | Matsuo et al. | 6,192,445 B1 | 2/2001 | Rezvani |
| 5,936,888 A | 8/1999 | Sugawara | 6,195,196 B1 | 2/2001 | Kimura et al. |
| 5,940,332 A | 8/1999 | Artieri | 6,198,342 B1 | 3/2001 | Kawai |
| 5,946,258 A | 8/1999 | Evertt et al. | 6,201,282 B1 | 3/2001 | Eitan |
| 5,946,558 A | 8/1999 | Hsu | 6,201,737 B1 | 3/2001 | Hollmer et al. |
| 5,949,714 A | 9/1999 | Hemink et al. | 6,205,056 B1 | 3/2001 | Pan et al. |
| 5,949,728 A | 9/1999 | Liu et al. | 6,205,059 B1 | 3/2001 | Gutala et al. |
| 5,963,412 A | 10/1999 | En | 6,208,200 B1 | 3/2001 | Arakawa |
| 5,963,465 A | 10/1999 | Eitan | 6,208,557 B1 | 3/2001 | Bergemont et al. |
| 5,966,603 A | 10/1999 | Eitan | 6,214,666 B1 | 4/2001 | Mehta |
| 5,969,989 A | 10/1999 | Iwahashi | 6,215,148 B1 | 4/2001 | Eitan |

| | | |
|---|---|---|
| 6,215,697 B1 | 4/2001 | Lu et al. |
| 6,215,702 B1 | 4/2001 | Derhacobian et al. |
| 6,218,695 B1 | 4/2001 | Nachumovsky |
| 6,219,277 B1 | 4/2001 | Devin et al. |
| 6,219,290 B1 | 4/2001 | Chang et al. |
| 6,222,762 B1 | 4/2001 | Guterman et al. |
| 6,222,768 B1 | 4/2001 | Hollmer et al. |
| 6,233,180 B1 | 5/2001 | Eitan et al. |
| 6,240,032 B1 | 5/2001 | Fukumoto |
| 6,240,040 B1 | 5/2001 | Akaogi et al. |
| 6,246,555 B1 | 6/2001 | Tham |
| 6,252,442 B1 | 6/2001 | Malherbe |
| 6,252,799 B1 | 6/2001 | Liu et al. |
| 6,256,231 B1 | 7/2001 | Lavi et al. |
| 6,261,904 B1 | 7/2001 | Pham et al. |
| 6,265,268 B1 | 7/2001 | Halliyal et al. |
| 6,266,273 B1 | 7/2001 | Conley et al. |
| 6,266,281 B1 | 7/2001 | Derhacobian et al. |
| 6,272,047 B1 | 8/2001 | Mihnea et al. |
| 6,275,414 B1 | 8/2001 | Randolph et al. |
| 6,281,545 B1 | 8/2001 | Liang et al. |
| 6,282,133 B1 | 8/2001 | Nakagawa et al. |
| 6,282,145 B1 | 8/2001 | Tran et al. |
| 6,285,246 B1 | 9/2001 | Basu |
| 6,285,574 B1 | 9/2001 | Eitan |
| 6,285,589 B1 | 9/2001 | Kajitani |
| 6,285,614 B1 | 9/2001 | Mulatti et al. |
| 6,292,394 B1 | 9/2001 | Cohen et al. |
| 6,297,096 B1 | 10/2001 | Boaz |
| 6,297,143 B1 | 10/2001 | Foote et al. |
| 6,297,974 B1 | 10/2001 | Ganesan et al. |
| 6,304,485 B1 | 10/2001 | Harari et al. |
| 6,307,784 B1 | 10/2001 | Hamilton et al. |
| 6,307,807 B1 | 10/2001 | Sakui et al. |
| 6,320,786 B1 | 11/2001 | Chang et al. |
| 6,324,094 B1 | 11/2001 | Chevallier |
| 6,326,265 B1 | 12/2001 | Liu et al. |
| 6,330,192 B1 | 12/2001 | Ohba et al. |
| 6,331,950 B1 | 12/2001 | Kuo et al. |
| 6,335,874 B1 | 1/2002 | Eitan |
| 6,337,502 B1 | 1/2002 | Eitan et al. |
| 6,339,556 B1 | 1/2002 | Watanabe |
| 6,343,033 B1 | 1/2002 | Parker |
| 6,346,442 B1 | 2/2002 | Aloni et al. |
| 6,348,381 B1 | 2/2002 | Jong |
| 6,348,711 B1 | 2/2002 | Eitan |
| 6,351,415 B1 | 2/2002 | Kushnarenko |
| 6,353,356 B1 | 3/2002 | Liu |
| 6,353,554 B1 | 3/2002 | Banks |
| 6,353,555 B1 | 3/2002 | Jeong |
| 6,356,469 B1 | 3/2002 | Roohparvar et al. |
| 6,359,501 B2 | 3/2002 | Lin et al. |
| 6,374,337 B1 | 4/2002 | Estakhri |
| 6,385,086 B1 | 5/2002 | Mihara et al. |
| 6,396,741 B1 | 5/2002 | Bloom et al. |
| 6,400,209 B1 | 6/2002 | Matsuyama et al. |
| 6,400,607 B1 | 6/2002 | Pasotti Eat et al. |
| 6,407,537 B2 | 6/2002 | Antheunis |
| 6,410,388 B1 | 6/2002 | Kluth et al. |
| 6,417,081 B1 | 7/2002 | Thurgate |
| 6,418,506 B1 | 7/2002 | Pashley et al. |
| 6,426,898 B1 | 7/2002 | Mihnea et al. |
| 6,429,063 B1 | 8/2002 | Eitan |
| 6,433,624 B1 | 8/2002 | Grossnikle et al. |
| 6,436,766 B1 | 8/2002 | Rangarajan et al. |
| 6,436,768 B1 | 8/2002 | Yang et al. |
| 6,438,031 B1 | 8/2002 | Fastow |
| 6,438,035 B2 | 8/2002 | Yamamoto et al. |
| 6,440,797 B1 | 8/2002 | Wu et al. |
| 6,442,074 B1 | 8/2002 | Hamilton et al. |
| 6,445,030 B1 | 9/2002 | Wu et al. |
| 6,449,190 B1 | 9/2002 | Bill |
| 6,452,438 B1 | 9/2002 | Li |
| 6,456,528 B1 | 9/2002 | Chen |
| 6,456,533 B1 | 9/2002 | Hamilton et al. |
| 6,458,656 B1 | 10/2002 | Park et al. |
| 6,458,677 B1 | 10/2002 | Hopper et al. |
| 6,469,929 B1 | 10/2002 | Kushnarenko et al. |
| 6,469,935 B2 | 10/2002 | Hayashi |
| 6,472,706 B2 | 10/2002 | Widdershoven et al. |
| 6,477,085 B1 | 11/2002 | Kuo |
| 6,490,204 B2 | 12/2002 | Bloom et al. |
| 6,496,414 B2 | 12/2002 | Kasa et al. |
| 6,510,082 B1 | 1/2003 | Le et al. |
| 6,512,701 B1 | 1/2003 | Hamilton et al. |
| 6,519,180 B2 | 2/2003 | Tran et al. |
| 6,519,182 B1 | 2/2003 | Derhacobian et al. |
| 6,522,585 B2 | 2/2003 | Pasternak |
| 6,525,969 B1 | 2/2003 | Kurihara et al. |
| 6,528,390 B2 | 3/2003 | Komori et al. |
| 6,529,412 B1 | 3/2003 | Chen et al. |
| 6,532,173 B2 | 3/2003 | Lioka et al. |
| 6,535,020 B1 | 3/2003 | Yin |
| 6,535,434 B2 | 3/2003 | Maayan et al. |
| 6,537,881 B1 | 3/2003 | Park et al. |
| 6,538,270 B1 | 3/2003 | Randolph et al. |
| 6,541,816 B2 | 4/2003 | Ramsbey et al. |
| 6,552,387 B1 | 4/2003 | Eitan |
| 6,555,436 B2 | 4/2003 | Ramsbey et al. |
| 6,559,500 B2 | 5/2003 | Torii |
| 6,562,683 B1 | 5/2003 | Wang et al. |
| 6,566,194 B1 | 5/2003 | Ramsbey et al. |
| 6,566,699 B2 | 5/2003 | Eitan |
| 6,567,303 B1 | 5/2003 | Hamilton et al. |
| 6,567,312 B1 | 5/2003 | Torii et al. |
| 6,574,139 B2 | 6/2003 | Kurihara |
| 6,577,514 B2 | 6/2003 | Shor et al. |
| 6,577,532 B1 | 6/2003 | Chevallier |
| 6,577,547 B2 | 6/2003 | Ukon |
| 6,583,005 B2 | 6/2003 | Hashimoto et al. |
| 6,583,479 B1 | 6/2003 | Fastow et al. |
| 6,584,017 B2 | 6/2003 | Maayan et al. |
| 6,590,811 B1 | 7/2003 | Hamilton et al. |
| 6,593,606 B1 | 7/2003 | Randolph et al. |
| 6,594,181 B1 | 7/2003 | Yamada |
| 6,608,526 B1 | 8/2003 | Sauer |
| 6,614,295 B2 | 9/2003 | Tsuchi |
| 6,614,686 B1 | 9/2003 | Kawamura |
| 6,614,692 B2 | 9/2003 | Maayan et al. |
| 6,617,179 B1 | 9/2003 | Kim |
| 6,617,215 B1 | 9/2003 | Halliyal et al. |
| 6,618,290 B1 | 9/2003 | Wang et al. |
| 6,624,672 B2 | 9/2003 | Confaloneri et al. |
| 6,627,555 B2 | 9/2003 | Eitan et al. |
| 6,630,384 B1 | 10/2003 | Sun et al. |
| 6,633,496 B2 | 10/2003 | Maayan et al. |
| 6,633,499 B1 | 10/2003 | Eitan et al. |
| 6,633,956 B1 | 10/2003 | Mitani |
| 6,636,440 B2 | 10/2003 | Maayan et al. |
| 6,639,271 B1 | 10/2003 | Zheng et al. |
| 6,639,837 B2 | 10/2003 | Takano et al. |
| 6,639,844 B1 | 10/2003 | Liu et al. |
| 6,639,849 B2 | 10/2003 | Takahashi et al. |
| 6,642,148 B1 | 11/2003 | Ghandehari et al. |
| 6,642,573 B1 | 11/2003 | Halliyal et al. |
| 6,642,586 B2 | 11/2003 | Takahashi |
| 6,643,170 B2 | 11/2003 | Huang et al. |
| 6,643,177 B1 | 11/2003 | Le et al. |
| 6,643,178 B2 | 11/2003 | Kurihara |
| 6,643,181 B2 | 11/2003 | Sofer et al. |
| 6,645,801 B1 | 11/2003 | Ramsbey et al. |
| 6,649,972 B2 | 11/2003 | Eitan |
| 6,650,568 B2 | 11/2003 | Iijima |
| 6,653,190 B1 | 11/2003 | Yang et al. |
| 6,653,191 B1 | 11/2003 | Yang et al. |
| 6,654,292 B2 * | 11/2003 | Keays .................. 365/185.33 |

| | | |
|---|---|---|
| 6,654,296 B2 | 11/2003 | Jang et al. |
| 6,664,588 B2 | 12/2003 | Eitan |
| 6,665,769 B2 | 12/2003 | Cohen et al. |
| 6,670,241 B1 | 12/2003 | Kamal et al. |
| 6,670,669 B1 | 12/2003 | Kawamura |
| 6,674,138 B1 | 1/2004 | Halliyal et al. |
| 6,677,805 B2 | 1/2004 | Shor et al. |
| 6,680,509 B1 | 1/2004 | Wu et al. |
| 6,686,242 B2 | 2/2004 | Willer et al. |
| 6,690,602 B1 | 2/2004 | Le et al. |
| 6,700,818 B2 | 3/2004 | Shappir et al. |
| 6,717,207 B2 | 4/2004 | Kato |
| 6,723,518 B2 | 4/2004 | Papsidero et al. |
| 6,731,542 B1 | 5/2004 | Le et al. |
| 6,738,289 B2 | 5/2004 | Gongwer et al. |
| 6,744,692 B2 | 6/2004 | Shiota et al. |
| 6,765,259 B2 | 7/2004 | Kim |
| 6,768,165 B1 | 7/2004 | Eitan |
| 6,788,579 B2 | 9/2004 | Gregori et al. |
| 6,791,396 B2 | 9/2004 | Shor et al. |
| 6,794,249 B2 | 9/2004 | Palm et al. |
| 6,831,872 B2 | 12/2004 | Matsuoka |
| 6,836,431 B2 | 12/2004 | Chang |
| 6,871,258 B2 | 3/2005 | Micheloni et al. |
| 6,885,585 B2 | 4/2005 | Maayan et al. |
| 6,912,160 B2 | 6/2005 | Yamada |
| 6,917,544 B2 | 7/2005 | Maayan et al. |
| 6,928,001 B2 | 8/2005 | Avni et al. |
| 6,937,523 B2 | 8/2005 | Eshel |
| 6,967,872 B2 | 11/2005 | Quader et al. |
| 6,996,692 B2 | 2/2006 | Kouno |
| 7,079,420 B2 | 7/2006 | Shappir et al. |
| 2001/0006477 A1 | 7/2001 | Banks |
| 2002/0004878 A1 | 1/2002 | Norman |
| 2002/0004921 A1 | 1/2002 | Muranaka et al. |
| 2002/0064911 A1 | 5/2002 | Eitan |
| 2002/0132436 A1 | 9/2002 | Eliyahu et al. |
| 2002/0140109 A1 | 10/2002 | Keshavarzi et al. |
| 2002/0145465 A1 | 10/2002 | Shor et al. |
| 2002/0191465 A1 | 12/2002 | Maayan et al. |
| 2002/0199065 A1 | 12/2002 | Subramoney et al. |
| 2003/0001213 A1 | 1/2003 | Lai |
| 2003/0021155 A1 | 1/2003 | Yachareni et al. |
| 2003/0021157 A1* | 1/2003 | Matsubara et al. ...... 365/185.33 |
| 2003/0028709 A1* | 2/2003 | Micheloni et al. ........... 711/103 |
| 2003/0072182 A1* | 4/2003 | Keays .................... 365/185.33 |
| 2003/0072192 A1 | 4/2003 | Bloom et al. |
| 2003/0076710 A1 | 4/2003 | Sofer et al. |
| 2003/0117841 A1 | 6/2003 | Yamashita |
| 2003/0131186 A1 | 7/2003 | Buhr |
| 2003/0134476 A1 | 7/2003 | Roizin et al. |
| 2003/0142544 A1 | 7/2003 | Maayan et al. |
| 2003/0145176 A1 | 7/2003 | Dvir et al. |
| 2003/0145188 A1 | 7/2003 | Cohen et al. |
| 2003/0155659 A1 | 8/2003 | Verma et al. |
| 2003/0190786 A1 | 10/2003 | Ramsbey et al. |
| 2003/0197221 A1 | 10/2003 | Shinozaki et al. |
| 2003/0202411 A1 | 10/2003 | Yamada |
| 2003/0206435 A1 | 11/2003 | Takahashi |
| 2003/0208663 A1 | 11/2003 | Van Buskirk et al. |
| 2003/0209767 A1 | 11/2003 | Takahashi et al. |
| 2003/0214844 A1 | 11/2003 | Iijima |
| 2003/0218207 A1 | 11/2003 | Hashimoto et al. |
| 2003/0218913 A1 | 11/2003 | Le et al. |
| 2003/0222303 A1 | 12/2003 | Fukuda et al. |
| 2003/0227796 A1 | 12/2003 | Miki et al. |
| 2004/0012993 A1 | 1/2004 | Kurihara |
| 2004/0013000 A1 | 1/2004 | Torii |
| 2004/0014290 A1 | 1/2004 | Yang et al. |
| 2004/0021172 A1 | 2/2004 | Zheng et al. |
| 2004/0027858 A1 | 2/2004 | Takahashi et al. |
| 2004/0151034 A1 | 8/2004 | Shor et al. |
| 2004/0153621 A1 | 8/2004 | Polansky et al. |
| 2004/0157393 A1 | 8/2004 | Hwang |
| 2004/0222437 A1 | 11/2004 | Avni et al. |
| 2005/0078528 A1* | 4/2005 | Tsang et al. ............ 365/185.29 |
| 2005/0117395 A1 | 6/2005 | Maayan et al. |
| 2005/0140405 A1 | 6/2005 | Do et al. |
| 2005/0207220 A1* | 9/2005 | Takeuchi ................ 365/185.03 |
| 2006/0069979 A1* | 3/2006 | Wu et al. ..................... 714/758 |
| 2006/0126382 A1 | 6/2006 | Maayan et al. |
| 2006/0126383 A1 | 6/2006 | Shappir et al. |

FOREIGN PATENT DOCUMENTS

| | | |
|---|---|---|
| EP | 0751560 | 6/1995 |
| EP | 0693781 | 1/1996 |
| EP | 0 822 557 | 2/1998 |
| EP | 0 843 398 | 5/1998 |
| EP | 0580467 | 9/1998 |
| EP | 0461764 | 7/2000 |
| EP | 1 071 096 | 1/2001 |
| EP | 1073120 | 1/2001 |
| EP | 1 091 418 | 4/2001 |
| EP | 1126468 | 8/2001 |
| EP | 0740307 | 12/2001 |
| EP | 1164597 | 12/2001 |
| EP | 1 207 552 | 5/2002 |
| EP | 1 223 586 | 7/2002 |
| EP | 1 365 452 | 11/2003 |
| EP | 001217744 | 3/2004 |
| GB | 1297899 | 11/1972 |
| GB | 2157489 | 3/1985 |
| JP | 54-053929 | 4/1979 |
| JP | 60-200566 | 10/1985 |
| JP | 60201594 | 10/1985 |
| JP | 63-249375 | 10/1988 |
| JP | 3-285358 | 12/1991 |
| JP | 04-226071 | 8/1992 |
| JP | 04-291962 | 10/1992 |
| JP | 05021758 | 1/1993 |
| JP | 06151833 | 5/1994 |
| JP | 06-232416 | 8/1994 |
| JP | 07193151 | 7/1995 |
| JP | 08-106791 | 4/1996 |
| JP | 08-297988 | 11/1996 |
| JP | 09-017981 | 1/1997 |
| JP | 09162314 | 6/1997 |
| JP | 10-106276 | 4/1998 |
| JP | 10 334676 | 12/1998 |
| JP | 11-162182 | 6/1999 |
| JP | 11-354758 | 12/1999 |
| JP | 2001-085646 | 3/2001 |
| JP | 2001-118392 | 4/2001 |
| JP | 2001-156189 | 6/2001 |
| JP | 2002-216488 | 8/2002 |
| JP | 3358663 | 10/2002 |
| WO | WO 81/00790 | 3/1981 |
| WO | WO 96/15553 | 5/1996 |
| WO | WO 96/25741 | 8/1996 |
| WO | WO 98/03977 | 1/1998 |
| WO | WO 99/31670 | 6/1999 |
| WO | WO 99/57728 | 11/1999 |
| WO | WO 00/46808 | 8/2000 |
| WO | WO 01/65566 | 9/2001 |
| WO | WO 01/65567 | 9/2001 |
| WO | WO 01/84552 | 11/2001 |
| WO | WO 02/43073 | 5/2002 |
| WO | WO 03/032393 | 4/2003 |
| WO | WO 03/036651 | 5/2003 |
| WO | WO 03/054964 | 7/2003 |
| WO | WO 03/063167 | 7/2003 |
| WO | WO 03/063168 | 7/2003 |
| WO | WO 03/079370 | 9/2003 |
| WO | WO 03/079446 | 9/2003 |
| WO | WO 03/083916 | 10/2003 |

| | | |
|---|---|---|
| WO | WO 03/088258 | 10/2003 |
| WO | WO 03/088259 | 10/2003 |
| WO | WO 03/088260 | 10/2003 |
| WO | WO 03/088261 | 10/2003 |
| WO | WO 03/088353 | 10/2003 |
| WO | WO 03/100790 | 12/2003 |

OTHER PUBLICATIONS

Bude et al., EEPROM/Flash Sub 3.0V drain—Source Bias Hot Carrier Writing, IEDM, 1995, pp. 989-992.

Bude et al., Secondary Electron Flash—a High Performance, Low Power Flash Technology for 0.35 um and below, IEDM, 1997, 279-282.

Bude et al., Modeling Nonequilibrium Hot Carrier Device Effects, Conference of Insulator Specialists of Europe, Jun. 1997, Sweden.

Jung et al., IEEE Journal of Solid-State Circuits, Nov. 1996, 1575-1583, vol. 31, No. 11.

Campardo et al., IEEE Journal of Solid-State Circuits, Nov. 2000, 1655-1667, vol. 35, No. 11.

Lin et al., Novel Source-Controlled Self-Verified Programming for Multilevel EEPROM's, IEEE Transactions on Electron Devices, Jun. 2000, 1166-1174, vol. 47, No. 6.

Chan et al., A True Single-Transistor Oxide-Nitride-Oxide EEPROM Device, IEEE Electron Device Letters, Mar. 1987, vol. EDL-8, No. 3.

Eitan et al., "Hot-Electron Injection into the Oxide in n-Channel MOS Devices", IEEE Transactions on Electron Devices, vol. ED-28, No. 3, pp. 328-370, Mar. 1981.

Roy Anirban, "Characterization and Modeling of Charge Trapping and Retention in Novel Multi-Dielectric Nonvolatile Semiconductor Memory Devices", Microelectronics Laboratory, Sherman Fairchild Center, Department of Computer Science and Electrical Engineering, Bethlehem, Pennsylvania, p. 1-35, 1989.

Ma et al., A Dual-bit Split-Gate EEPROM (DSG) Cell in Contactless Array for Single-Vcc High Density Flash Memories, IEEE, 1994, 57-60.

Oshima et al., Process and Device Technologies for 16Mbit EPROMs with Large-Tilt-Angle Implanted P-Pocket Cell, IEEE, Dec. 1990, Ch. 2865-4/90/0000-0095, pp. 5 2 1-5 2 4, San Francisco, California.

Lee, A new approach for the floating-gate MOS nonvolatile memory, Applied Physics Letters, Oct. 1977, 475-476, vol. 31, No. 7, American Institute of Physics.

Glasser et al., MOS Device Electronics, The Design and Analysis of VLSI Circuits, Chapter 2, 67-163, 1998, Addison-Wesley Publishing Company.

Bhattacharyya et al., FET Gate Structure for Nonvolatile N-Channel Read-Mostly Memory Device, IBM Technical Disclosure Bulletin, Nov. 1975, 1768, vol. 18, No. 6.

Ricco et al., Nonvolatile Multilevel Memories for Digital Applications, Dec. 1998, 2399-2421, vol. 86, No. 12, Institute of Electrical and Electronics Engineers, Inc.

Martin, Improved Circuits for the Realization of Switched-Capacitor Filters, IEEE Transactions on Circuits and Systems, Apr. 1980, 237-244, vol. CAS-27.

Tseng et al., "Thin CVD Stacked Gate Dielectric for ULSI Technology", IEEE, pp. 321-214; 1993, 13.1.1-13.1.4.

Pickar, Ion Implementation is Silicon—Physics, Processing, and Microelectronic Devices, Applied Solid State Science, 1975, 151-241, vol. 5, Academic Press.

2 Bit/Cell EEPROM Cell Using Band-To-Band Tunneling for Data Read-Out, IBM Technical Disclosure Bulletin, 1992, 136-140, vol. 35 No. 4B.

Umezawa et al., A 5-V-Only Operation 0.6-µm Flash EEPROM with Row Decoder Scheme in Triple-Well Structure, IEEE Journal of Solid-State Circuits, 1992, 1540, vol. 27.

Mitchell et al., A new self-aligned planar array cell for ultra high density EPROMS, 1987.

Esquivel et al., High Density Contactless, Self Aligned EPROM Cell Array Technology, 1986.

Johns, Martin, Analog Integrated Circuit Design, Jun. 1, 1997, Chapter 10, John Wiley and Sons Inc.

Allen et al., CMOS Analog Circuit Design, 2002, 259 pages, Oxford University Press.

Klinke et al., A very-high-slew-rate CMOS operational amplifier, IEEE Journal of Solid-State Circuits, 1989, 744-746, 24 vol.

Shor et al, paper WA2.04.01—Self regulated Four phased charge pump with boosted wells, ISCAS 2002.

Fotouhi, An efficient CMOS line driver for 1.544-Mb/s T1 and 2.048-Mb/s E1 applications, IEEE Journal of Solid-State Circuits, 2003, 226-236pages, 38vol.

P-N Junction Diode, Physics of semiconductor devices, 1981, Ch. 2, "A Wiley-Interscience Publication", John Wiley & Sons Publishers.

Chang, Non Volatile Semiconductor Memory Devices, Proceedings of the IEEE, 64 vol., No. 7, pp. 1039-1059; Jul. 1976.

Yoon, Sukyoon, et al., A Novel Substrate Hot Electron and Hole Injection Structure with a double-implanted buried-channel MOSFET, IEEE Transactions on Electron Devices, Dec. 1991, p. 2722, vol. 38, No. 12.

4 Bits of Digital Data Fit in a Single Cell, Technology Newsletter, Electronic Design, Apr. 1, 1996.

M. Specht et al, Novel Dual Bit Tri- Gate Charge Trapping Memory Devices, IEEE Electron Device Letters, vol. 25, No. 12, Dec. 2004, pp. 810-812.

Bu, Jiankang et al., "Design Considerations in Scaled SONOS Nonvolatile Memory Devices" Lehigh University, Bethlehem, PA, Power Point Presentation, pp. 1-24, 2000; http://klabs.org/richcontent/MemoryContent/nvmt_symp/nvmts_2000/presentations/bu_white_sonos_lehigh_univ.pdf.

Adams et al., "SONOS Nonvolatile Semiconductor Memories for Space and Military Applications", Symposium, 2000. http://klabs.org/richcontent/MemoryContent/nvmt_symp/nvmts_2000/papers/adams_d.pdf.

"Philips Research—Technologies—Embedded Nonvolatile Memories" http://research.philips.com/technologies/ics/nvmemories/index.html, Jun. 9, 2006.

"Semiconductor Memory: Non-Volatile Memory (NVM)", National University of Singapore, Department of Electrical and Computer Engineering: http://ece.nus.edu.sg/stfpage/elezhucx/myweb/NVM.pdf, 2000.

* cited by examiner

METHOD OF ERASING NON-VOLATILE MEMORY CELLS

FIELD OF THE INVENTION

The present invention relates to non-volatile memory cell arrays generally and to their erasure in particular.

BACKGROUND OF THE INVENTION

Non-volatile memory cell arrays are typically designed to undergo 100K programming and erasure cycles and to retain the stored data in each cell for a significant period of time, such as ten years. The ability of the cell to endure the required number of program and erasure cycles and to retain the data over time strongly depends on the erase operation.

The erase process is schematically illustrated in FIG. 1, to which reference is now made. Prior to erasure, the programmed cells may have a distribution, labeled 10, of threshold voltages above a program verify (PV) level. During erasure, the entire array is erased at once, one pulse at a time. After the first pulse, program distribution 10 has shifted lower, to a distribution 12. After each pulse, the array is "verified" to determine if all the cells have been erased below an erase verify (EV) level. The process is repeated until all of the cells are verified. In FIG. 1, the array required 3 pulses, generating distributions 12, 14 and 16, until all cells had threshold voltages below the EV level. The final distribution 16 is also known as the "erase distribution" 16.

Unfortunately, some of the cells are erased quickly (within 2 pulses in FIG. 1) while others take much longer to erase (the full 3 pulses), resulting in a wide distribution, indicated by arrow 18. Those that have undergone extra erase pulses may be over-erased, a non-ideal state.

Over-erasure may have many causes, among them the non-uniformity in the dimensions of cells within the array, the width of the program distribution of the array cells, the erase algorithm, the electrical as well as the physical characteristics of the cells, etc.

Over-erasure may impact product reliability as well as product performance. One aspect of this is "margin loss", shown in FIG. 2, to which reference is now made.

An array may begin with program distribution 10, above program verify level PV, and erase distribution 16, below erase verify level EV. A read level RD is defined between the two verify levels. If the cell has a threshold voltage above read level RD, the cell is defined as programmed. Otherwise, the cell is defined as erased Margins M may be defined as well, in which case, the cell is considered programmed only if its threshold voltage is above a level RD+M0 and erased only if its threshold voltage is below a level RD−M1.

Over time, both distributions may shift lower and spread out, to become distributions 10' and 16', respectively. Unfortunately, distributions 10 and 16 may shift enough that a net margin NM, defined as the difference between the highest erase level E1 and the lowest program level P1, no longer guarantees a correct read operation. This is discussed in more detail in Applicant's copending application, U.S. Ser. No. 11/007,332, filed Dec. 9, 2004 which application is incorporated herein by reference.

FIG. 3, to which reference is now made, illustrates the change in net margin NM for a typical array over time after 100K cycles at elevated temperature (150° C.). The example of FIG. 3 is an emulation of a product lifetime, as is known in the art. Net margin NM may reduce from 1200 mV to 300 mV, a change of 900 mV. The smaller net margin NM at 100 min may be insufficient for a read operation.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
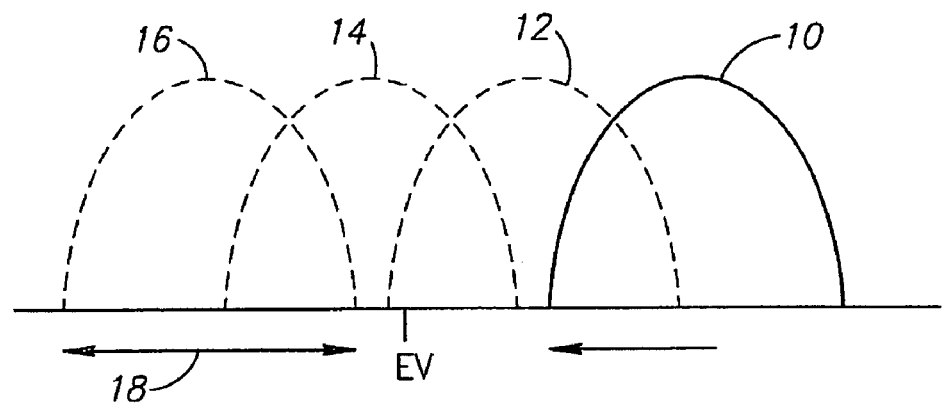
FIG. 1 is schematic illustration of a distribution of threshold voltages of array cells during a prior art erase procedure.
Figure 2:
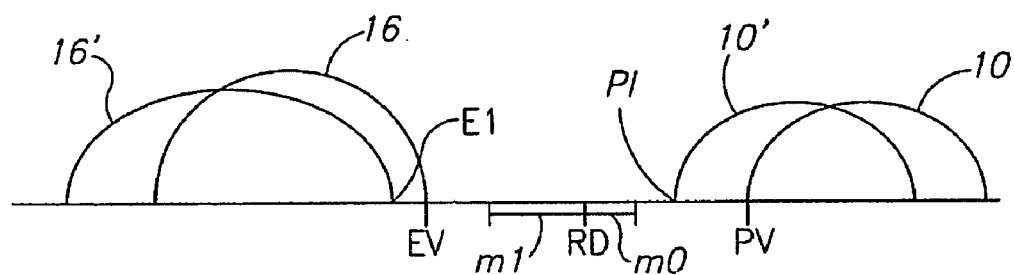
FIG. 2 is a schematic illustration of the distributions of threshold voltages during operation of an array.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements

DETAILED DESCRIPTION OF THE PRESENT INVENTION

In the following detailed description, numerous specific details are set forth in order to provide a thorough understanding of the invention However, it will be understood by those skilled in the art that the present invention may be practiced without these specific details. In other instances, well-known methods, procedures, and components have not been described in detail so as not to obscure the present invention.

Applicants have realized that over-erasure and its attendant margin loss may be increased the more bits that are erased at one time. This is demonstrated in FIGS. 4A and 4B, to which reference is now made. Both figures compare data for three modes of operation, a "sector mode" where 0.5M bits are erased together, a "page mode" where 2K bits are erased together and a "byte mode" where eight (8) bits are erased together.

Figure 3:
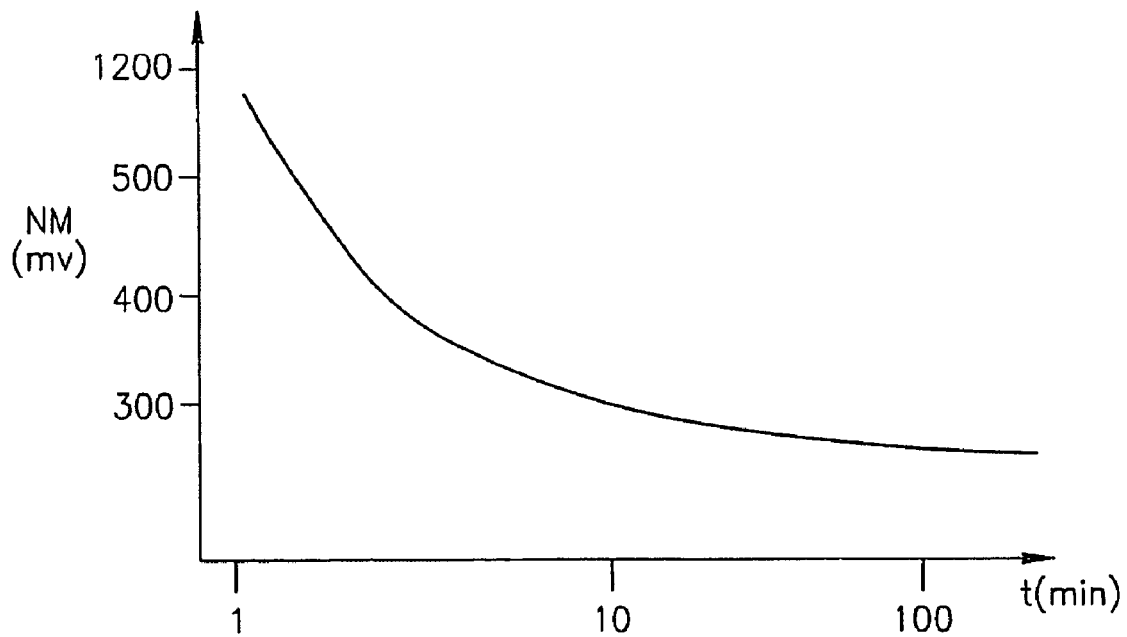
FIG. 3 is a graphical illustration of margin loss over time after 100K cycles at elevated temperature for a prior art array.
Figure 4A:
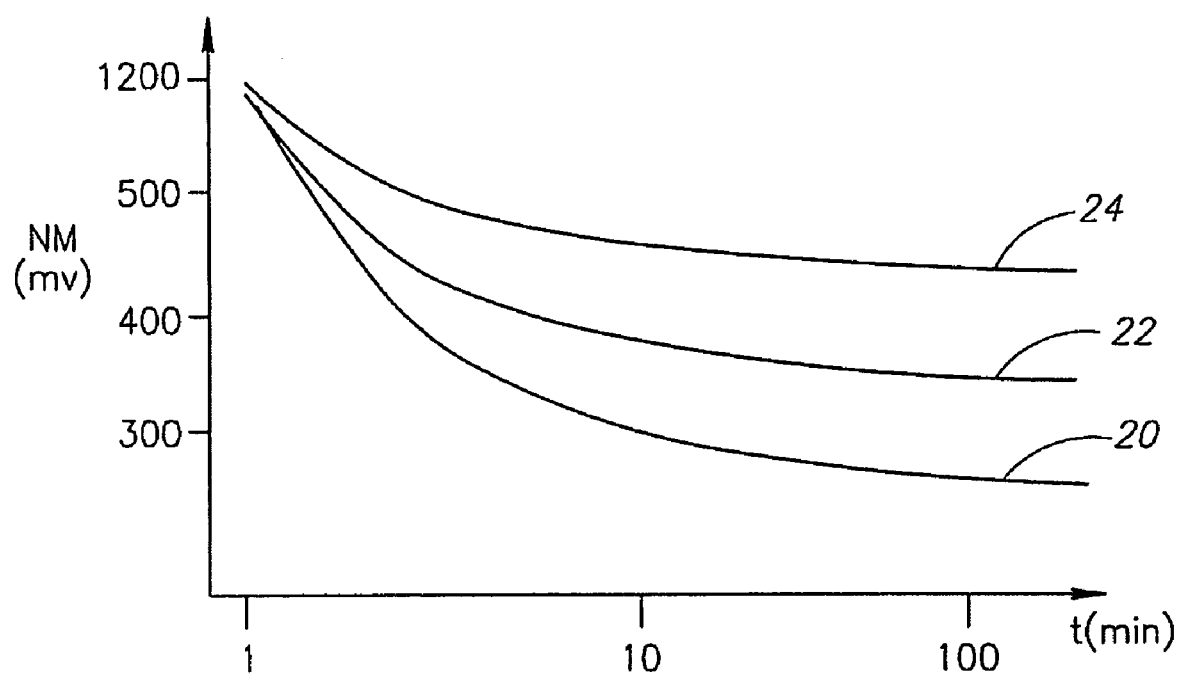
FIG. 4A is a graphical illustration of margin loss for different modes of operation of the array.

FIG. 4A is similar to FIG. 3 and shows the change in net margin over time, for sector mode (curve 20), page mode (curve 22) and byte mode (curve 24). It can be seen that the net margin change is more severe in sector mode (curve 20) and least severe for byte mode (curve 24).

Figure 4B:
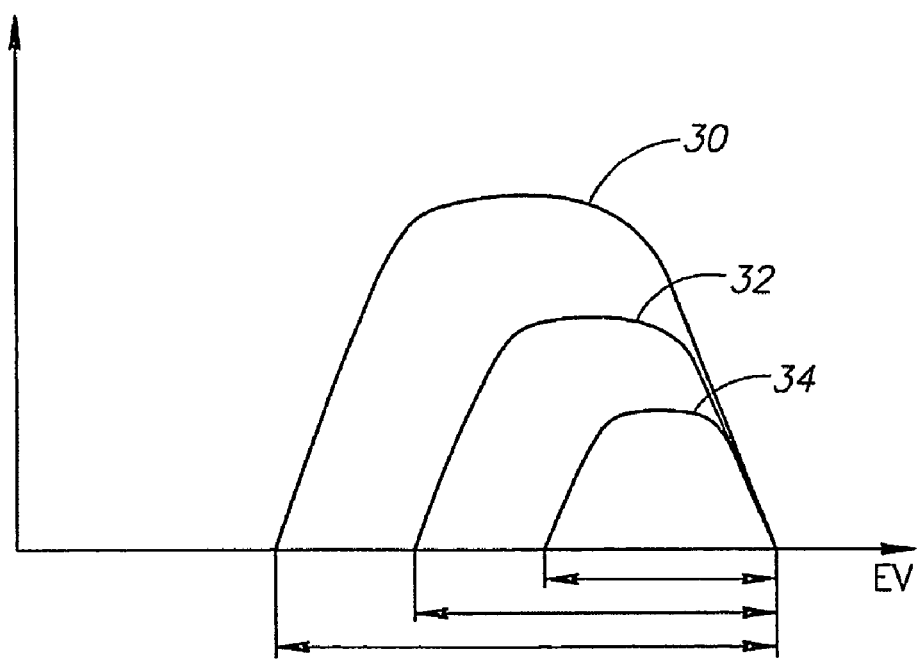
FIG. 4B is a graphical illustration of erase distributions for the modes of operation FIG. 4A.

In FIG. 4B, three erase distributions 30 (sector mode), 32 (page mode) and 34 (byte mode) are compared. As can be seen, distribution 30 is wider than distribution 32 and distribution 34 is narrowest. The width of the distribution appears to decrease with the number of bits that are erased at once.

FIGS. 4A and 4B may indicate that over-erasure and margin loss over time after cycling may be increased the more bits that are erased at one time.

Applicants have realized that the erase distribution may be narrowed by segmenting the erase operation into different groups. Segmentation may allow fewer bits per erase group which may provide improved homogeneity within the erase group. With improved homogeneity associated with fewer cells to be erased at once, there may be a smaller spread to the erase distribution of each segment or group and the resultant erase distribution of the array will be narrower. In such a method, the causes of wide erase distribution, such as the non-uniformity of the cells, the erase algorithm and the program distribution, may be partially overcome.

Applicants have further realized that the termination of the erase operation may be determined using a group of rows or word lines WLs. In accordance with a preferred embodiment of the present invention, the erase pulses may be provided simultaneously to all groups of word lines at a time. The erase operation may stop for an erase group when the group is erase verified. The other erase groups may continue the erasure operation until they are erase verified.

Figure 5:
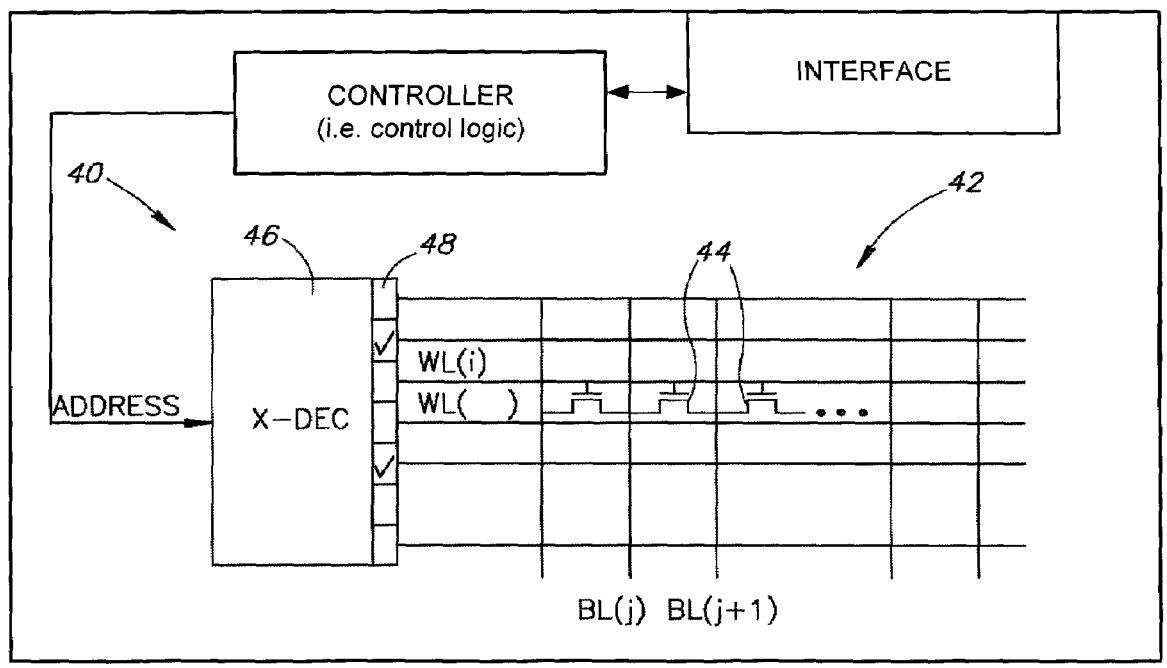
FIG. 5 is a schematic illustration of portions of a non-volatile memory chip, constructed and operative in accordance with the present invention.

Reference is now made to FIG. 5, which illustrates a portion of a memory chip 40, constructed and operative in accordance with the present invention, in which groups of rows are erased together. Memory chip 40 may comprise a memory array 42, formed of word lines WL(i) (the "rows") and bit lines BL(j) (the "columns"). Cells 44, which may be any suitable non-volatile memory, such as a single or dual-bit NROM (nitride read only memory) cell, may be found at the intersections of a word line WL with a bit line BL.

As should be understood by one of skill in the NVM arts, the chip 40 includes other functional blocks, including an external interface, charge pumps and a controller (i.e. control logic). These functional blocks are a fundamental and inherent part of any NVM chip, including the chip of which a portion is shown in FIG. 5.

In accordance with a preferred embodiment of the present invention, memory chip 40 may further comprise an X decoder 46 having an erase flag register 48 storing the grouping of word lines WL. It will be appreciated that the physical location of register 48 may be in any suitable location and not necessarily as indicated by the figure.

During regular operation, X decoder 46 may decode an incoming address to determine which word lines WL(i) to activate to access the desired cell. A Y-decoder (not shown) may select the appropriate bit line BL(j) to access the desired cell.

During erasure, X decoder 46 may activate the word lines WL(i) by their groups and according to the information stored in erase flag register 48. The word lines WL(i) may be grouped according to any suitable means, such as M consecutive word lines, where M may be greater than or equal to 1. Typically M may be 4-16.

In another embodiment, word lines WL(i) may be grouped in a pattern that is aligned with the non-uniformity of the array. For example, some word lines WL(i) may be closer to a metal to bit line contact (i.e. the point at which the current arrives at the bit line BL) and others may be further away. In one array with an erase sector of 128-512 word lines, the metal to bit line contact may be located every 16 or 32 word lines WLs. In this embodiment, word lines WL(i) may be grouped according to how far they are from the metal to bit line contact.

In the present invention, the first erase pulse may be provided to the entire array, after which the array may be erase verified, group by group. When a group passes erase verification, then the erase operation may be stopped for that group (this may be implemented by changing the flags of the word lines of the group). Those groups not erase verified may receive the next erase pulses, until there are no groups left that have not yet been erase verified.

Thus, the erase operation may be segmented by the speed of erasure of each of the selected groups. Those word line groups that may be erase verified after N pulses may be differentiated from those groups that are erase verified after N+m pulses, where m is greater than or equal to 1.

Since the number of cells being erased together may be smaller in the present invention and/or the groups may be more homogeneous, the decision to stop erasure may occur earlier for most groups, resulting in fewer over-erased cells. This may result in a narrower erase distribution, as shown in FIG. 6, to which reference is now briefly made.

Figure 6:
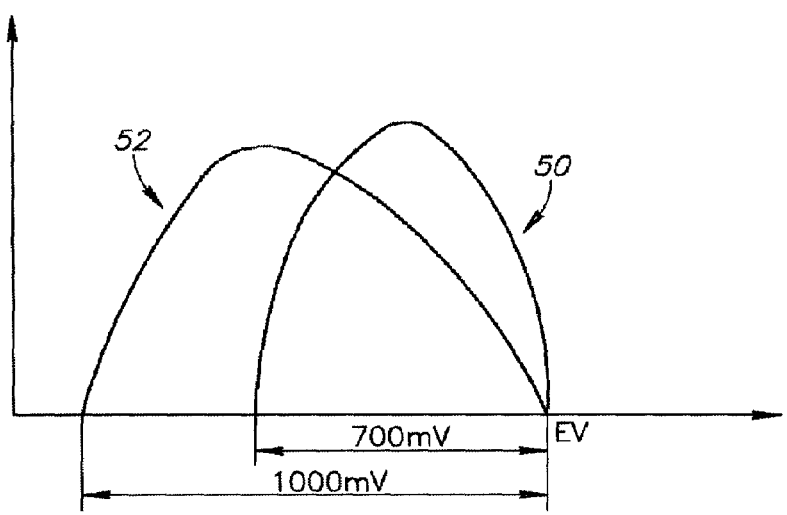
FIG. 6 is a schematic illustration of an erase distribution in the memory array of the chip of FIG. 5.

FIG. 6 graphs an erase distribution 50 for a standard sector erase operation and an erase distribution 52 for the present invention. It can be seen that sector erase distribution 50 has a width of 1000 mV while erase distribution 52 has a spread of only 700 mV.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A non-volatile memory chip comprising:
   a memory array of non-volatile memory cells formed into rows and columns;
   a logic circuit adapted to determine groups of rows to erase together;
   an X decoder to activate a row of said memory array; and
   an erase flag register to identify groups of said rows to erase together.

2. The chip according to claim 1 and wherein each said group is a set of M consecutive rows.

3. The chip according to claim 1 and wherein each said group is a set of N rows aligned with a non-uniformity in said array.

4. The chip according to claim 1 and wherein each said group is a set of A rows aligned with a non-uniformity in programming speed of the array cells during program operation.

5. The chip according to claim 1 and wherein each said group is a set of B rows aligned with a non-uniformity in erase speed of the array cells during erase operation.

6. The chip according to claim 1 and wherein each said group is a set of C rows aligned with a non-uniformity in the distance of a row from a strapping location for said row.

7. The chip according to claim 1 and wherein each said group is a set of D rows which erased within the same number of pulses during a previous erase operation.

8. A method comprising:
   determining groups of rows to erase together to minimize the width of a resultant erase threshold voltage distribution;
   erasing said groups together;
   stopping erasure of a group when said group is erase verified; and
   performing said step of erasing on those groups which were not previously erase verified.

9. The method according to claim 8 and wherein each said group is a set of M consecutive rows.

10. The method according to claim 8 and wherein each said group is a set of N rows aligned with the array non-uniformity.

11. The method according to claim 8 and wherein each said group is a set of A rows aligned with a non-uniformity in programming level and speed of the array cells during program operation.

12. The method according to claim 8 and wherein each said group is a set of B rows aligned with a non-uniformity in erase speed of the array cells during erase operation.

13. The method according to claim 8 and wherein each said group is a set of C rows defined by the distance of a row from a strapping location for said row.

14. The method according to claim 8 and wherein each said group is a set of D rows which erased within the same number of pulses during a previous erase operation.

15. A method comprising:
    determining groups of rows to erase together in order to minimize the margin loss associated with bake resulting from multiple program and erasure cycles.

16. The method according to claim 15 and wherein each said group is a set of M consecutive rows.

17. The method according to claim 15 and wherein each said group is a set of N rows aligned with the array non-uniformity.

18. The method according to claim 15 and wherein each said group is a set of A rows aligned with a non-uniformity in programming level and speed of the array cells during program operation.

19. The method according to claim 15 and wherein each said group is a set of B rows aligned with a non-uniformity in erase speed of the array cells during erase operation.

20. The method according to claim 15 and wherein each said group is a set of C rows defined by the distance of a row from a strapping location for said row.

21. The method according to claim 15 and wherein each said group is a set of D rows which erased within the same number of pulses during a previous erase operation.

* * * * *